United States Patent
Stich et al.

(10) Patent No.: US 11,782,116 B2
(45) Date of Patent: Oct. 10, 2023

(54) METHOD FOR RECORDING A MAGNETIC RESONANCE IMAGE DATASET, DATA MEDIUM, COMPUTER PROGRAM PRODUCT, AND MAGNETIC RESONANCE INSTALLATION

(71) Applicant: Siemens Healthcare GmbH, Erlangen (DE)

(72) Inventors: Manuel Stich, Parkstein (DE); Richard Dederichs, Heßdorf (DE); Herbert Köstler, Retzbach (DE); Tobias Wech, Würzburg (DE); Anne Slawig, Halle (Saale) (DE)

(73) Assignee: Siemens Healthcare GmbH, Erlangen (DE)

(*) Notice: Subject to any disclaimer, the term of this patent is extended or adjusted under 35 U.S.C. 154(b) by 39 days.

(21) Appl. No.: 17/393,962

(22) Filed: Aug. 4, 2021

(65) Prior Publication Data

US 2022/0043093 A1 Feb. 10, 2022

(30) Foreign Application Priority Data

Aug. 4, 2020 (DE) .................... 10 2020 209 783.6

(51) Int. Cl.
*G01R 33/56* (2006.01)
*G01R 33/565* (2006.01)
*G01R 33/561* (2006.01)

(52) U.S. Cl.
CPC ... *G01R 33/56572* (2013.01); *G01R 33/5613* (2013.01)

(58) Field of Classification Search
CPC .............. G01R 33/543; G01R 33/5608; G01R 33/4828; G01R 33/3415; G01R 33/283;
(Continued)

(56) References Cited

U.S. PATENT DOCUMENTS 6,160,397 A * 12/2000 Washburn ........ G01R 33/56554
324/309
2017/0089996 A1* 3/2017 Feiweier .............. G01R 33/583
(Continued)

FOREIGN PATENT DOCUMENTS

DE 102017207904 A1 11/2018

OTHER PUBLICATIONS

Aigner, Christoph S., et al. "Time optimal control-based RF pulse design under gradient imperfections." Magnetic resonance in medicine 83.2 (2020): 561-574.
(Continued)

*Primary Examiner* — Jermele M Hollington
*Assistant Examiner* — Taqi R Nasir
(74) *Attorney, Agent, or Firm* — Lempia Summerfield Katz LLC

(57) ABSTRACT

A method for recording a magnetic resonance image dataset includes providing a magnetic resonance sequence with a series of sequence blocks, and providing at least one correction term to compensate for a magnetic field change. The magnetic field change is produced as a change of an actual magnetic field compared to a setpoint magnetic field by gradient pulses. The magnetic field change is established via a transfer characteristic of the gradient system of the magnetic resonance installation. The at least one correction term is used to compensate for the magnetic field change, and at least one magnetic resonance image dataset is recorded with the magnetic resonance sequence using the correction term.

18 Claims, 6 Drawing Sheets

(58) Field of Classification Search
CPC .................. G01R 33/307; G01R 33/60; G01R 33/56572; G01R 33/5613; G01V 3/32; E21B 49/08; E21B 2049/085; G01N 24/10

See application file for complete search history.

(56) References Cited

U.S. PATENT DOCUMENTS

2018/0144467 A1* 5/2018 Sofka .................. G01R 33/445
2018/0329010 A1 11/2018 Kluge et al.

OTHER PUBLICATIONS

Bieri, Oliver, and Klaus Scheffler. "Fundamentals of balanced steady state free precession MRI." Journal of Magnetic Resonance Imaging 38.1 (2013): 2-11.

Bruijnen, Tom, et al. "Prospective GIRF-based RF phase cycling to reduce eddy current-induced steady-state disruption in bSSFP imaging." Magnetic resonance in medicine 84.1 (2020): 115-127.

Campbell-Washburn, Adrienne E., et al. "Real-time distortion correction of spiral and echo planar images using the gradient system impulse response function." Magnetic resonance in medicine 75.6 (2016): 2278-2285.

Fischer, Rudolf Fritz, et al. "Monitoring and compensating phase imperfections in cine balanced steady-state free precession." Magnetic resonance in medicine 70.6 (2013): 1567-1579.

German Office Action for German Application No. 10 2020 209 783.6 dated Apr. 28, 2021.

Hargreaves, Brian. "Rapid gradient-echo imaging." Journal of Magnetic Resonance Imaging 36.6 (2012): 1300-1313.

K. Scheffler et al. "Principles and applications of balanced SSFP techniques" (2003) 13: 2409-2418.

M. A. Bernstein et al.: Handbook of MRI pulse sequences, Elsevier Academic Press, Amsterdam, Chapter 14.1, pp. 579-607, 2004.

Robison, Ryan K., et al. "Correction of B0 eddy current effects in spiral MRI." Magnetic resonance in medicine 81.4 (2019): 2501-2513.

Stich, Manuel, et al. "Gradient waveform pre-emphasis based on the gradient system transfer function." Magnetic resonance in medicine 80.4 (2018): 1521-1532.

Stich, Manuel: "Compatibility in Medical Imaging:"; 2019; DOI: https://doi.org/10.25972/OPUS-20347; English summary see p. 170.

Vannesjo, S. Johanna, et al. "Image reconstruction using a gradient impulse response model for trajectory prediction." Magnetic resonance in medicine 76.1 (2016): 45-58.

Vannesjo, Signe J., et al. "Gradient system characterization by impulse response measurements with a dynamic field camera." Magnetic resonance in medicine 69.2 (2013): 583-593.

* cited by examiner

METHOD FOR RECORDING A MAGNETIC RESONANCE IMAGE DATASET, DATA MEDIUM, COMPUTER PROGRAM PRODUCT, AND MAGNETIC RESONANCE INSTALLATION

This application claims the benefit of German Patent Application Number 10 2020 209 783.6, filed on Aug. 4, 2020, which is hereby incorporated by reference in its entirety.

BACKGROUND

The present embodiments relate to a method for recording a magnetic resonance image dataset with a magnetic resonance installation having a gradient system, and further having a data medium, a computer program product, and a magnetic resonance installation.

To carry out magnetic resonance measurements, two different magnetic fields are used. A basic magnetic field $B_0$ is employed in order to obtain a surplus of magnetization. This may be flipped from the rest position by a radio frequency pulse $B_1$.

In order to make possible a selection of a desired slice and a spatial encoding, there are also magnetic field gradients G. A magnetic resonance installation typically has a gradient coil consisting of three separate coils, which create gradients in the x, y, and z direction. The z direction in this case is by definition the direction of the basic magnetic field $B_0$, and the x-axis, y-axis, and z-axis are at right angles to one another.

In a Steady State Free Precession (SSFP) sequence, there is a state of equilibrium, also referred to as the steady state, between the excitation and the relaxation of the magnetization. Between the excitation pulses, the nuclear spins precess unhindered (e.g., Free Precession). In general, SSFP sequences are based on a gradient echo sequence with a small flip angle and a short repetition time. SSFP gradient echo sequences contain transversal coherences (e.g., magnetizations) from overlapping spin echoes of multiple order and stimulate echoes. This is achieved as a rule through a refocusing (e.g., rewind) of the phase encoding gradient in each repetition interval (TR), in order to keep a corresponding gradient moment constant or at zero. Completely balanced SSFP sequences (bSSFP) reach a phase of zero, in that all imaging gradients are refocused.

A single gradient switch from a start value to one or more target values, and, where necessary, back to the start value (e.g., zero) is also referred to as a gradient pulse. The gradient moment in this case is the integral of the gradient strength of the gradient pulse over the time in which the gradient pulse is present.

It is basically known that currents applied to the gradient coil for creating the gradients do not exactly create the fields that the currents should. In order to compensate for the effects of eddy currents, it is known, for example, to measure out occurrence of the eddy currents as a function of the actually desired nominal gradients in order to adapt the currents of the gradient coils so that, at the end, the nominal gradient is present. To this end, the nominal gradient or the associated current is pre-emphasized, so that the pre-emphasized gradient under the influence of the emphasis of the eddy currents overall produces the nominal gradient. The nominal gradient may also be referred to as the setpoint gradient. The values for the pre-emphasis are stored in a characteristic field, which is referred to as the pre-emphasis filter or also pre-emphasis. The values needed in each case are taken from this in order to pre-emphasize the gradients or the creating currents.

To achieve an optimal imaging of the anatomy of a patient, it is very frequent for the direction of the imaging gradients to be twisted in relation to the direction of the physical gradients. Two or three axes of the gradient coil are then activated to create one imaging gradient. In such cases, for each gradient coil, this may result in different deviations of the desired gradient form from the actual gradient form. The deviations may be described by a transmission characteristic. The transmission characteristic specifies the deviation of a setpoint initial value from an actual initial value, related to one or more input values. A possible transmission characteristic in the period is the Gradient Impulse Response Function (GIRF).

Taking account of the gradient pulse response in the pre-emphasis filter is also known (see, e.g., DE 10 2017 207 904 A1). A formula for calculating the gradient pulse response is to be found in Vannesjo et al.: Image Reconstruction Using a Gradient Impulse Response Model for Trajectory Prediction, Magnetic Resonance in Medicine 76:45-58 (2016).

As well as the gradient pulse response, the Gradient System Transfer Function (GSTF) is also used. The Gradient System Transfer Function GSTF lies in the frequency space and is obtained from the gradient pulse response GIRF lying in the time space through a Fourier transform $\mathfrak{F}$.

$$\text{GSTF}(f) = \mathfrak{F}\{\text{GIRF}(t)\}$$

The GSTF may likewise be used to pre-emphasize the applied gradients, such as described, for example, in M. Stich, T. Wech, A. Slawig et al. "Gradient Waveform Pre-Emphasis Based on the Gradient System Transfer Function: Magnetic Resonance in Medicine 2018; 80: 1521-1532. In this paper, the GSTF of an MR system has been determined and used to predict the k-space trajectories, but also to correct the applied gradients through a corresponding pre-emphasis.

SUMMARY AND DESCRIPTION

The scope of the present invention is defined solely by the appended claims and is not affected to any degree by the statements within this summary.

A deviation of the gradients from the expected form is, for example, problematic in Steady State Free Precession (SSFP) measurement sequences, since the deviation destroys the steady state (e.g., the state of equilibrium).

Using this as a starting point, the present embodiments may obviate one or more of the drawbacks or limitations in the related art. For example, a method for recording a magnetic resonance dataset in which a reduction of artifacts resulting from gradient errors during a recording of a magnetic resonance dataset (e.g., with a steady state of magnetization) is provided.

A method includes providing a magnetic resonance sequence for carrying out a magnetic resonance measurement. The magnetic resonance sequence has a series of sequence blocks, and in each sequence block, an excitation section and at least one detection section is present. The magnetic resonance sequence has at least one gradient pulse. The method includes providing at least one correction term for compensating for a magnetic field change. The magnetic field change is produced as a change of an actual field to a setpoint field by the gradient pulse. The magnetic field change is determined via a transfer characteristic of the gradient system of the magnetic resonance installation, and the transfer characteristic represents the system characteristic of the gradient system in amplitude and/or phase of different frequencies. The at least one correction term is used to compensate for the magnetic field change, and at least one magnetic resonance image dataset is recorded with the magnetic resonance sequence using the correction term.

A correction term is, for example, an energization specification or a change in current for one or more coils (e.g., a gradient coil or a shim coil). Via the energization of the coil, a compensation field that, for example, compensates for the magnetic field change is produced. The correction term may, if necessary, also directly specify the compensation field. In accordance with another form of embodiment, the correction term is used to create a compensation phase (e.g., specifies an undesired or an unwanted phase shift or an unwanted change of the basic magnetic field).

In one embodiment, the transfer function GSTF may be used as the transfer characteristic. This may be determined as described in the above-mentioned article by M. Stich. However, other transfer characteristics are also covered by the present embodiments, which describe the behavior of the gradient system (e.g., the created actual fields by comparison with the setpoint fields).

It has been shown that, in application of gradient pulses, not only a deviation of the gradient on the same gradient axis arises, but also on the other gradient axes. The first effect is the self term, the second relates to cross terms. Further, an effect is produced on the basic magnetic field $B_0$ and also on terms of higher order, such as quadratic terms or cubic terms. All the effects lead to faults in and/or changes to the steady state of the magnetization and ultimately to image artifacts.

Via the GIRF or GSTF, all these magnetic field effects or magnetic field changes are able to be determined: the effect of a gradient on the basic field (e.g., constant field, 0th order), an effect of a gradient (e.g., linear gradient) on itself (e.g., self term, 1st order), an effect of a gradient on the other two gradients (e.g., cross terms, 1st order), and higher-order effect (e.g., quadratic, cubic (2nd order and higher)).

A separate correction term may be defined for each of these deviations. The correction for the 0th order may, as described later, take place in two ways (e.g., for the correction of the 0th order, the reference phase of the magnetic resonance installation may be corrected). The correction terms of the 1st order may be grouped together or implemented independently of one another. For example, for correction of the 1st order, the pre-emphasis filter of the magnetic resonance installation may be adapted. A correction of the higher-order terms may be omitted for as long as the created artifacts do not cause any faults in the image.

In accordance with one form of embodiment, the correction term may be used to create a compensation moment, which is added to at least one phase encoding gradient and/or phase rewind gradient.

In one embodiment, a compensation field created from the correction term may be applied in each sequence block. In order to maintain the steady state of the magnetization, all magnetic field changes, for example, are compensated for. As a rule, these occur in all sequence blocks.

As described, a number of types of magnetic field changes that are caused by a gradient pulse and may be present during or after the gradient pulse exist. A correction term may be present for each independently of the others (e.g., also for a number at the same time).

In order to correct a gradient pulse with the transfer function GSTF(f), this may be pre-emphasized with the transfer function. With this, the nominal gradient $G_{nom,k}(t)$ will ultimately be applied, where k stands for one of the axes x, y or z. With a 1st order correction, the pre-emphasis may be described as follows:

$$G_{pre,k}(t) = \Im^{-1}\{\Im\{G_{nom,k}(t)\}/\text{GSTF}_k^{l=1}(f)\}$$

In this case, l refers to the order of the transfer function of the gradient system of the magnetic resonance installation, k refers to one of the gradient axes x, y, or z, $\Im$ refers to a Fourier transform, $\Im^{-1}$ refers to an inverse Fourier transform, and $G_{nom,k}$ refers to the desired nominal gradient or gradients on the gradient axis x, y, z. The pre-emphasized gradients $G_{pre,k}(t)$ are thus applied in order, for a given transfer function GSTF(f), to obtain the nominal gradient $G_{nom,k}(t)$.

The transfer function GSTF may be present in the frequency space and for each axis and orders l=0, 1, . . . . The nominal gradient $G_{nom}$ may be predetermined in the time space. The nominal gradient $G_{nom}$ is therefore to be Fourier-transformed in order likewise to be transferred into the frequency space. Then the transformed nominal gradient $G_{nom}$ may be divided by the transfer function GSTF (f). This quotient is inverse Fourier-transformed in order to obtain a transfer into the time space.

The correction may also extend to all gradient axes k=x, y, z, or just to one or two definitive axes.

The magnetic resonance sequence has a series of sequence blocks. In each sequence block, there is at least one excitation section and one detection section present, where an excitation section has at least one excitation impulse, and in a detection section, an FID, an echo signal, or an echo train is recorded as a measurement signal. A sequence block contains a predetermined series of radio-frequency (RF) impulses, gradient pulses, acquisition windows, or wait times. In one embodiment, a sequence block corresponds to a repetition time TR.

The present embodiments may basically be applied in different magnetic resonance imaging sequences, including gradient echo (GE) measurement sequences or spin echo (SE) measurement sequences. Examples of gradient echo measurement sequences are Fast Low Angle SHot (FLASH), Fast Imaging with Steady Precession (FISP)-measurement sequence, or also balanced Steady State Free Precession (bSSFP). One example of spin echo measurement sequences is Turbo Spin Echo (TSE).

In one embodiment, a Steady State Free Precessing (SSFP) measurement sequence (e.g., a balanced Steady State Free Precession (bSSFP) measurement sequence) is used as a magnetic resonance sequence. Alternate forms of embodiment of an SSFP measurement sequence are a Fast Imaging with Steady-State Precession (FISP) measurement sequence or a PSIF measurement sequence. PSIF in this case is a reversal of the acronym FISP and is intended to express the fact that the echo encoding in PSIF runs in the reverse order, compared to FISP.

The measurement sequence may further be a bSSFP measurement sequence (e.g., TrueFISP). In order to reach the balanced-out state, in the bSSFP measurement sequence, the gradient moment of all gradients over a repetition time TR is to produce the value zero. Since gradients may have a bipolar effect on the nuclear spin, it is possible to reverse corresponding effect by opposing gradients.

Different sampling schemes exists for sampling the k-space (e.g., Cartesian, spiral-shaped, or also random). The path, with which the k-space is sampled, is referred to in this case as the k-space trajectory. The sampling scheme in this case is basically independent of the measurement sequence.

With a bSSFP measurement sequence, for example, each of the sampling schemes may be used.

The present embodiments have proven advantageous for sampling schemes in which large "jumps" occur in a gradient from TR to TR. If, for example, in a Cartesian sampling, adjacent rows are not sampled chronologically after one another, large jumps in the phase encoding gradients are to be provided, so that a deviation between actual and setpoint gradient has great effects on the steady state of the magnetization.

In accordance with a form of embodiment, the at least one correction term is used for creating a compensation field, where the compensation field is applied at least for a time (e.g., in at least a few of the sequence blocks) after at least one detection section of the magnetic resonance sequence. In one embodiment, in each sequence block, at least one compensation field is applied in order, with SSFP sequences, to achieve a correct refocusing of the transversal magnetization.

Through a compensation field, a compensation gradient moment may, for example, be created. By adaptation of the gradient moments (e.g., of the gradient or gradients in the phase encoding direction) for taking into account a magnetic field change of the gradient fields, the formation of artifacts in the recording of a magnetic resonance dataset is prevented. This is one possible implementation of the correction of the self term. Instead of continuously switching the correction gradients, the integral is formed over a repetition time TR, or a half repetition time TR from excitation to the middle of the echo or from the middle of the echo to the next excitation, and this amount is added to the phase rewind gradients, and the phase encoding gradients for a half repetition time TR. This provides that no gradient pulses have to be applied at other points in time.

The transfer characteristic is to either be known or be established at the beginning of the method (e.g., by a measurement). Since a one-time measuring-out is sufficient, and this may be measured during the installation or during startup of the magnetic resonance installation, it may be assumed that the transfer characteristic is stored in a memory. But this too is not mandatory; it is sufficient if, using the transfer characteristic, the correction term or terms such as, for example, gradient correction terms are established. The establishing of the correction terms, as described further below, occurs at different times. Depending on the time of establishment, the transfer characteristic is to be available when the method is carried out or, if correction terms or specifications have been derived from the transfer characteristic, also not. In this case, the transfer characteristic may also be stored in an accessible cloud; the transfer characteristic does not actually have to be stored directly in the device memory.

Thus, only the correction terms are to be available. These too, as described further below, may be employed in various manners. The use of a correction term thus only provides that, for example, in the case of the 1st order (e.g., the linear terms), a gradient pulse creates a gradient moment other than the one that does not take into account the magnetic field change. This is not intended to be a definition with respect to the modification of the gradient pulses but only to express the effect created.

In one embodiment, the magnetic field change may be a magnetic field change of the basic magnetic field $B_0$, and the correction term may be established for creation of a compensation phase or a basic compensation field. Through $B_0$ eddy currents, the switching of the gradient pulses leads to a magnetic field change $\Delta B_0$ of the basic magnetic field $B_0$, also referred to as "$B_0$ deviation".

In one embodiment, the magnetic field change of the basic magnetic field change may be computed as:

$$\Delta B_{k,l=0}(t) = \mathcal{F}^{-1}(\mathcal{F}\{G_{nom,k}(t)\} \cdot \text{GSTF}_{k,l}(f)).$$

where l is the 0th order of the transfer function of the gradient system of the magnetic resonance installation, k is one of the gradient axes (x, y, z), $\mathcal{F}$ is a Fourier transform, and $G_{nom,k}$ is the nominal gradient or gradients applied to the gradient axis (x, y, z). An overall change of the basic magnetic field is produced for the 0th order as a sum of the axis-wise deviations:

$$\Delta B_{l=0} = \Sigma_k \Delta B_{k,l=0}$$

Should a single axis κ, κ=x or y or z turn out to be the main cause of the magnetic field change, it may even be assumed that $\Delta B_{k=\kappa, l=0}$. Thus, only the 0th order and the axis κ are taken into account.

The magnetic field change $\Delta B_0$ of the basic magnetic field $B_0$ leads uncorrected to an undesired phase change $\Delta \phi$ of the magnetization. This fault may be compensated for in two ways: The phase change may not be allowed to arise at all, in that using a coil, a basic compensation field is applied. This is set in opposition to the computed magnetic field change of the basic magnetic field in order to compensate for the computed magnetic field change of the basic magnetic field. The basic compensation field is thus a field in space of constant field strength that is applied for a predetermined period of time. In this case, a shim coil, an additional coil, or the coil for creating the basic magnetic field $B_0$ may be used. The coil for creating the basic magnetic field normally acts too slowly to compensate for short-term $B_0$ changes. Additional hardware may therefore be required.

In order to avoid this hardware, it is therefore easier to allow the magnetic field change of the basic magnetic field. The phase that is produced may be determined from the magnetic field change of the basic magnetic field:

$$\Delta \phi = \int \gamma \cdot \Delta B \, dt.$$

This phase may be compensated for through the adaptation of the magnetic resonance installation. For example, with this, a software solution is realized. With this, a continuous adaptation of the phase is also possible.

Further, the magnetic field change may be a magnetic field change of at least one gradient field, and a correction term may be determined for creating at least one compensation gradient moment. The magnetic field change may be caused as a result of self terms and/or cross terms and leads to a deviation of the actual gradient moment from the setpoint gradient moment. For this portion of the magnetic field change too, a correction may be provided (e.g., in the form of the compensation gradient moment). This may extend over one or more of the gradient axes.

In one embodiment, all gradient pulses after a detection section may be corrected by a compensation moment. In one embodiment, all gradients in the phase encoding direction and/or read direction and/or slice selection direction may be corrected by a compensation moment.

The compensation moment may be added to an existing gradient moment and may produce an additional gradient moment or be arranged in a time section of a sequence block, to which, at least in this direction, no gradient has been applied. This is referred to as a free compensation moment. A compensation moment arises in this case via a gradient or a gradient change, which is present for a length of time.

In one embodiment, the compensation moment may be applied as a free compensation moment after a gradient. At this point, oscillations that have been created by the gradient may be compensated for by the compensation moment.

In one embodiment, the compensation moment (e.g., as a free compensation moment) may be continuously applied in a predetermined time section. This time section may be after the detection section. The compensation moment (e.g., the free compensation moment and/or the additional compensation moment) may be applied in the phase encoding direction and/or in the read direction and/or in the slice selection direction.

In addition or as an alternative, the magnetic field change may be a magnetic field change of a field term of an order greater than 1, and a compensation field moment may be determined as a correction term. In this case, quadratic terms or cubic terms may, for example, be involved. The compensation field moment may be provided by one or more shim coils.

In one embodiment, the correction term or terms may be stored in a pre-emphasis filter for the gradient system. The pre-emphasis filter is a characteristic field. The relevant correction terms are then selected automatically. Depending on the gradient pulses being employed, the applicable characteristic curve or the applicable characteristic field is used in each case. Through this, the correction is automatically employed in each magnetic resonance sequence that uses the pre-emphasis filter. These may be all magnetic resonance sequences. The gradient correction term is then provided via the pre-emphasis filter.

The pre-emphasis filter may be used, for example, for correction of the magnetic field deviation exclusively.

As an alternative, in addition to or instead of the pre-emphasis filter, the correction term may be determined based on the selected magnetic resonance sequence and the parameters stored there. This may, for example, take place "on the fly", as disclosed in DE 10 2017 207 904 A1. If a part of the correction is already predetermined by a pre-emphasis filter, the computation may take place after an optimization. Then, the portion that is already realized by the pre-emphasis filter is to be deducted from the correction term computed for the present magnetic resonance sequence.

Further, the magnetic resonance installation may have a pre-emphasis filter for the gradient system, and the pre-emphasis filter may be used to compensate for deviations of the gradient pulses. In the pre-emphasis filter, self terms and/or cross terms and/or the basic magnetic field and/or fields of higher orders than 1 may be taken into account.

In one embodiment, the transfer characteristic of the gradient system has orders, and the correction term is established at least for the 0th order and/or the 1st order. The more orders are taken into account, the more accurate is the correction. In one embodiment, only the 0th order and/or the 1st order may be established.

In accordance with a further aspect, the present embodiments relate to a method for carrying out a phase correction during a magnetic resonance measurement with a magnetic resonance installation that has a gradient system with a number of gradient coils. The method includes providing a transfer characteristic of the gradient system of the magnetic resonance installation. The transfer characteristic represents the system characteristic of the gradient system in amplitude and/or phase of different frequencies. The method includes providing a magnetic resonance sequence for carrying out the magnetic resonance measurement. At least one gradient pulse is applied in the magnetic resonance sequence. The gradient pulse is created by at least one of the gradient coils. The method includes providing at least one correction time in the magnetic resonance sequence, at which a phase correction is carried out, and providing a phase deviation as a deviation of an actual phase from a setpoint phase. The actual phase is obtained by the application of the at least one gradient pulse. The phase deviation is established using the transfer characteristic. The method also includes setting a reference phase of the magnetic resonance installation as phase correction to compensate for the phase deviation during the running of the magnetic resonance sequence at the correction time.

It is thus possible to compensate for the effect of the $B_0$ cross terms via the reference phase of the magnetic resonance installation. This may take place at any time during the running of a magnetic resonance sequence.

A correction time is a defined point in time during the execution of the magnetic resonance sequence at which a phase correction is carried out, in that the reference phase of the magnetic resonance installation is changed over. There may be at least one (e.g., a number of) correction time for a magnetic resonance sequence. For example, there may be at least one (e.g., precisely one) correction time per sequence block. As an alternative, at least two (e.g., a number of) correction time points per sequence block may be used.

The correction via the reference phase of the magnetic resonance installation takes place such that, at a correction time, the new reference phase $\phi_{ref,\ new}$ of the magnetic resonance installation is produced from the previous reference phase $\phi_{ref,\ old}$ of the magnetic resonance installation via the established phase deviation $\Delta\phi$:

$$\phi_{ref,new} = \phi_{ref,old} + \Delta\phi$$

Thus, before the correction time, $\phi_{ref,\ old}$ is the reference phase of the magnetic resonance installation, as from the correction time, the reference phase of the magnetic resonance installation is $\phi_{ref,\ new}$.

If during the execution of the magnetic resonance sequence a number of adaptations of the reference phase of the magnetic resonance installation are undertaken, then the phase deviation is computed as from the last correction time.

With the method described, it is possible to correct phase deviations (e.g., GIRF-based phase deviations) by adapting the reference phase of the magnetic resonance installation at any given point in time and as often as desired. The described method thus allows a quasi-continuous correction of phase deviations for any given measurement sequences.

In one embodiment, the transfer function GSTF of the gradient system of the magnetic resonance installation may be used as the transfer characteristic.

The change in the basic magnetic field may be established by measurements. This is very complex, however. The magnetic field change may thus be computed as already described above from the GSTF as:

$$\Delta B_{k,l=0}(t) = \mathcal{F}^{-1}(\mathcal{F}\{G_{nom,k}(t)\} \cdot \mathrm{GSTF}_{k,l}(f)).$$

where l refers to the 0th order of the transfer function GSTF of the gradient system of the magnetic resonance installation, k refers to one of the gradient axes x, y or z, $\mathcal{F}$ refers to a Fourier transform, and $G_{nom,k}$ refers to the gradient pulse or pulses applied to the gradient axis k. The computation thus relates to the axes defined via the gradient coils.

From the magnetic field change, a resulting phase deviation $\Delta\phi$ may be computed as:

$$\Delta\phi = \int \gamma \cdot \Delta B\ dt,$$

where $\Delta B$ is the magnetic field change, $\gamma$ is the gyromagnetic ratio, and ($\int dt$) is an integral over the time.

The reference phase of the magnetic resonance installation is adjusted by precisely the value by which a phase deviation has been produced. In other words, the reference phase of the magnetic resonance installation is traced.

In one embodiment, a correction time may lie before a sequence event. Sequence events, as described above, are radio-frequency impulses, gradient pulses, wait times, and acquisition windows. In one embodiment, a correction time may be placed directly before a read gradient. As an alternative or in addition, a correction time may be placed directly before a radio-frequency impulse of the magnetic resonance sequence.

As an alternative or in addition, a correction time may be placed directly after a gradient pulse. If, for example, the reference phase of the magnetic resonance installation is adapted after the slice selection gradient or the slice rephasing gradient, then as a result, a phase error that is to be taken into account is no longer present.

In one embodiment, a correction time may be placed after each gradient pulse. Further, a correction time may be placed after each gradient pulse of which the moment exceeds a threshold value. Other criteria, through which "relevant" gradient pulses may be defined, may be provided. For example, a phase encoding gradient has different strengths from sequence block to sequence block. It is therefore possible to not provide any correction after some of the phase encoding gradients.

If a correction time is defined in a sequence block, this correction time is used in a plurality of sequence blocks or all of the sequence blocks. For example, the correction time may be used in each nth sequence block with n=1 or 2 or . . . . The correction time may thus also be employed just in each second or third sequence block.

As an alternative or in addition, the correction times may be applied quasi-continuously. This may take place with and without taking into account sequence events. Thus, sequence events may be predetermined for which a phase correction takes place in the form of an adaptation of the reference phase of the magnetic resonance installation. In order to fill the gaps between these sequence events, additional correction times are predetermined in order to arrive at a quasi-continuous correction.

As an alternative, a fixed time interval for the correction times may also be predetermined. Either no account is taken of sequence events, or it takes place in the form of a negative selection. For example, a change of the reference phase of the magnetic resonance installation during an acquisition window may be excluded.

The present embodiments also relate to a computer program product that may be loaded into a memory of a programmable control facility or a computing unit of a magnetic resonance installation. With this computer program product, all or various forms of embodiment of the method described above may be carried out when the computer program product is running in the control facility. In this case, the computer program product may need program means (e.g., libraries and auxiliary functions) in order to realize the corresponding forms of embodiment of the method.

In other words, software with which one of the forms of embodiment described above of the method may be carried out or which carries out this form of embodiment is to be placed under protection with the computer program product, for example. In such cases, the software may involve a source code (e.g., C++) that still is to be compiled and linked or just is to be interpreted. Alternatively, the software may involve an executable software code that only has to be loaded into the appropriate computing unit or control facility for execution.

As well as this, the present embodiments relate to a data medium (e.g., a non-transitory computer-readable storage medium) for a control facility for controlling a computer (e.g., a data generation unit of a magnetic resonance installation and/or an evaluation unit), with data for carrying out the described method. In one embodiment, the data generation unit may be an image generation unit. The evaluation unit may be a component of the magnetic resonance installation or an external unit. Then, the data medium may also be a permanently accessible memory of the magnetic resonance installation. For this, the data medium does not have to be built into the control facility of the magnetic resonance installation; the data medium may also be embodied as a memory service or cloud server.

The aforementioned method may be implemented in the control apparatus in this case as software or also as hardware (e.g., hard-wired hardware).

As well as this, the present embodiments relate to a magnetic resonance installation with a gradient system and a control facility. The magnetic resonance installation is characterized in that the control facility is embodied for carrying out the method as described. The gradient system may include three gradient coils for creating three magnetic field gradients. The created magnetic field gradients may be at right angles to one another.

Further embodiments of the magnetic resonance installation correspond to corresponding embodiments of the method. To avoid unnecessary repetitions, the reader is thus referred to the corresponding method features and corresponding advantages.

DETAILED DESCRIPTION

Figure 1:
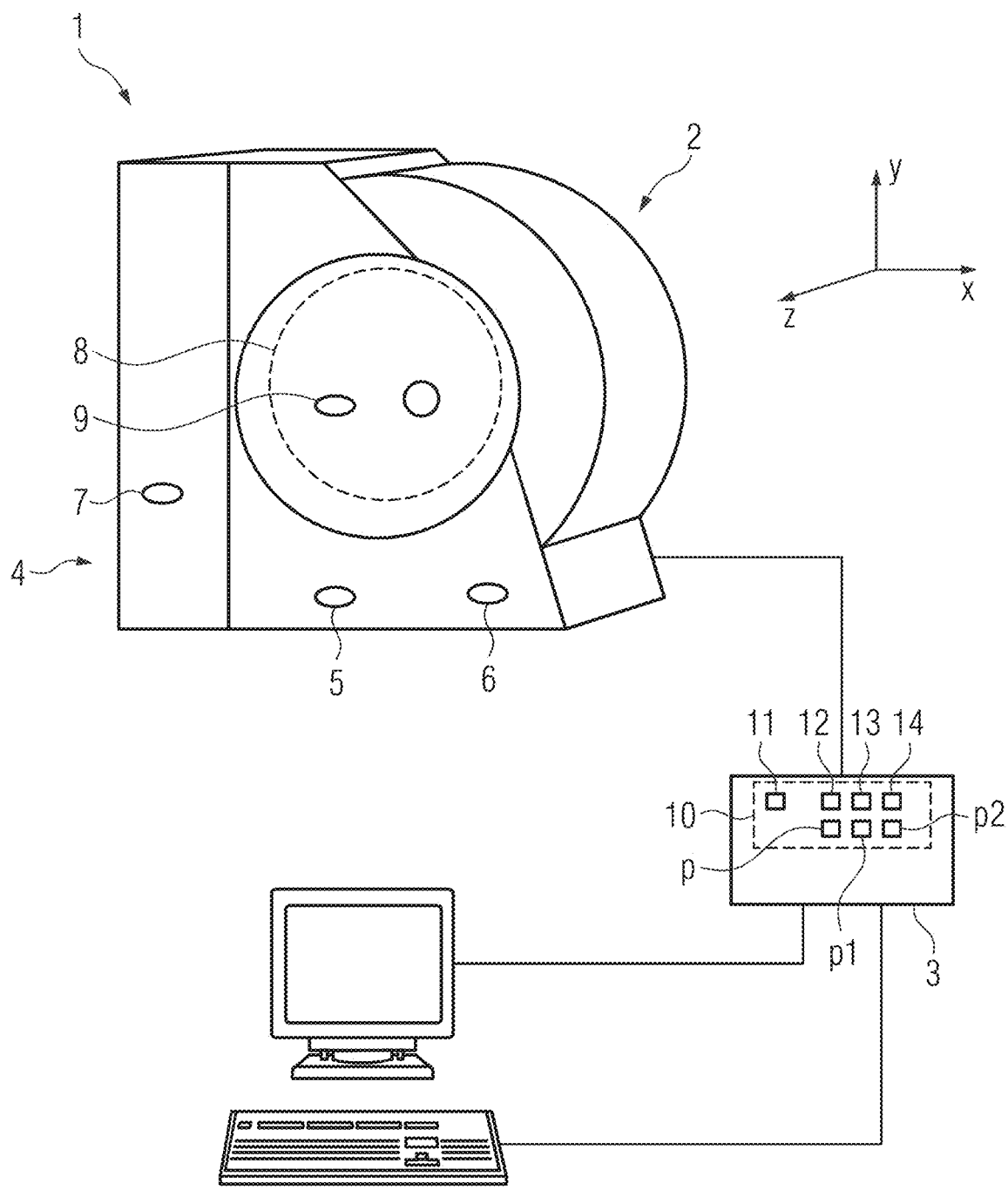
FIG. 1 shows one embodiment of a magnetic resonance installation.

FIG. 1 shows one embodiment of a magnetic resonance installation 1 with a scanner 2 and a control facility 3. The scanner 2 includes a gradient system 4 consisting of three separate coils 5, 6, and 7 for creation of three gradient fields. The gradient fields able to be created are aligned in the x-, y-, and z-direction and are at right angles to one another.

Arranged at the scanner 2 is also a transmit coil arrangement 8 and a receive coil arrangement 9. The transmit coil arrangement 8 may be embodied as a whole-body coil. The receive coil arrangement 9 may be embodied as a coil array. The receive coil arrangement 9 is used as a local coil.

Basically, however, the transmit coil arrangement 8 may also be used for signal receipt. The use of a receive coil arrangement 9, however, increases not only the signal-to-noise ratio SNR per se, but may also be used to carry out parallel imaging. This enables the measurement time to be reduced.

The control facility 3 of the magnetic resonance installation 1 has a data medium 10 on which a computer program product 11 for carrying out the described method is stored. Stored on the data medium 10 may be a bSSFP measurement sequence 12 with Cartesian k-space sampling, a bSSFP measurement sequence 13 with spiral-shaped sampling, and other magnet resonance sequences 14.

As well as this, at least one pre-emphasis filter p, p1 and/or p2 may be stored on the data medium.

For the sake of clarity, additional usual components of the magnetic resonance installation 1, such as a patient couch, etc., are not shown.

Figure 2:
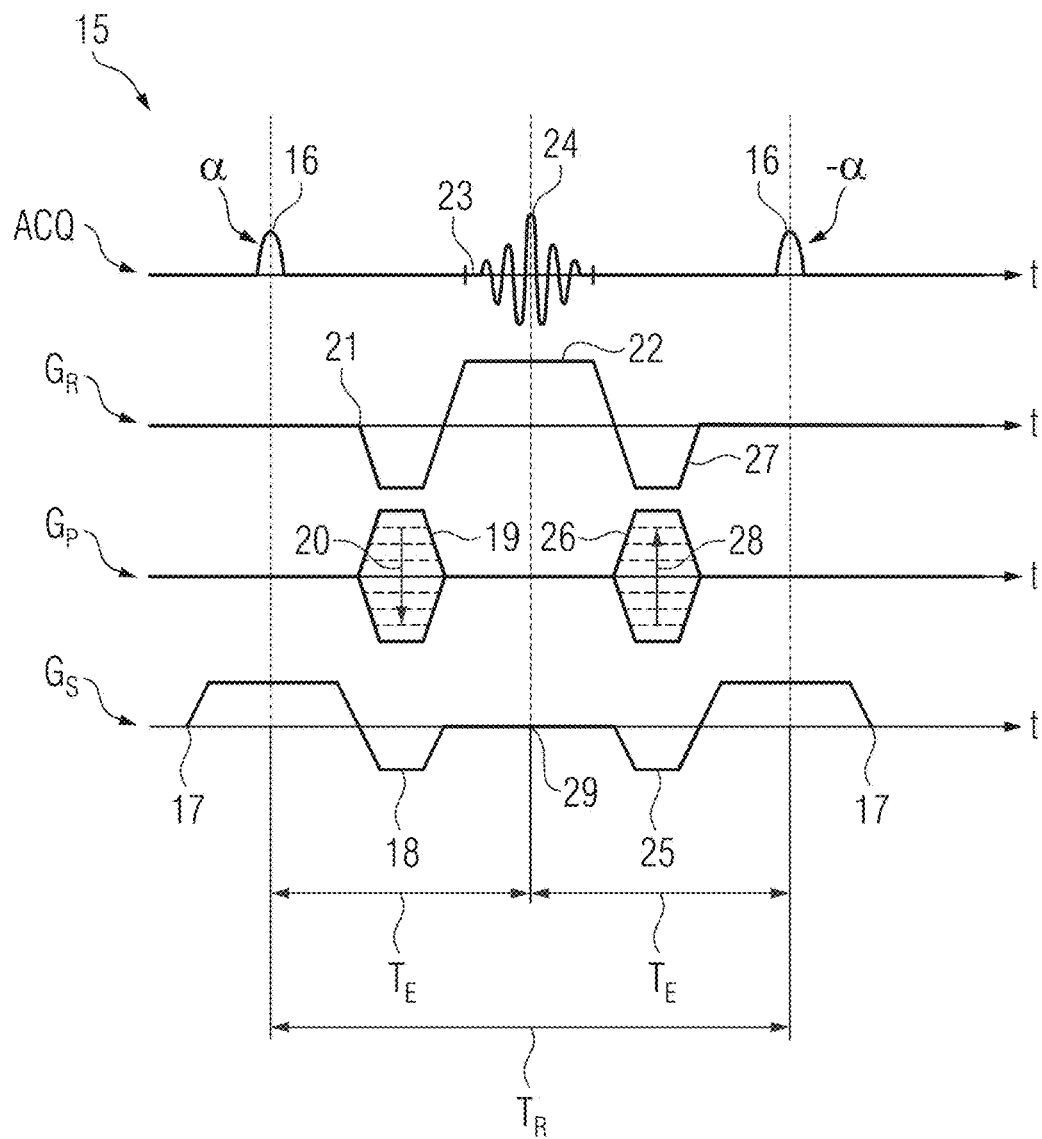
FIG. 2 shows an exemplary bSSFP sequence diagram with Cartesian k-space sampling.

FIG. 2 shows a bSSFP sequence diagram 15 for bSSFP measurement sequence 12 with a Cartesian sampling scheme. The imaging gradient axes are labeled as usual with $G_R$ for the read direction, $G_P$ for the phase encoding direction, and $G_S$ for the slice selection direction. These may match the axes x, y and z from FIG. 1, as described in the introduction, but do not have to do so.

Even if the axes match, a fixed assignment is not mandatory, and the axis of the read direction may thus lie in the direction of the x-, y-, or z-axis. The axis of the phase encoding direction and the axis of the slice selection direction are distributed between the remaining axes from the group x-axis, y-axis, and z-axis.

Usually, however, the axes do not match. The gradients in the directions $G_R$, $G_P$, and $G_S$ are then formed by two or three of the coils 5, 6 and 7, and thus, the gradients are formed in the direction of the axes x, y, and z.

ACQ refers to the axis for the radio-frequency impulses and acquisition window.

In order to excite only one slice with the radio-frequency impulses 16, a slice selection gradient 17 is present at the same time as the radio-frequency impulse 16 in the slice selection direction $G_S$. In order to compensate for a dephasing effect on the magnetization in the transversal plane, a slice rephasing gradient 18 follows on directly from the slice selection gradient 17.

The radio-frequency impulses of two consecutive sequence blocks may have two alternating RF-phases $\alpha$ and $-\alpha$ in this case.

In phase encoding direction $G_P$, a phase encoding gradient 19 is used. This is provided from sequence block to sequence block (e.g., in each of the $n_{pe}$ repetitions, with varying strengths) in order to create a spatial encoding in phase encoding direction $G_P$. This is indicated by the arrow 20.

The read dephasing gradient 21 and the read gradient 22 lie in direction $G_R$. An acquisition window 23 is open at the same time as the read gradient 22 in order to record the echo signal 24.

In addition to these gradients, which are present for imaging in all magnetic resonance sequences in which a Cartesian sampling of the k-space is undertaken, a slice rewind gradient 25 and a further slice selection gradient 17 are present in the slice selection direction $G_S$. The slice selection gradient 17 is assigned to the next radio frequency impulse 16 of the next sequence block. These provide that the bSSFP measurement sequence 11 is "balanced" over a repetition time $T_R$ in the slice selection direction $G_S$. For example, the sums of the gradient moments in slice selection direction $G_S$ are equal to zero over a repetition time $T_R$.

With the same purpose, a phase rewind gradient 26 and a read rewind gradient 27 are also present. In the phase rewind gradient 26, an arrow 28 is arranged in the opposite direction to the arrow 20. This shows the opposite polarity of the phase encoding gradient 19 compared to the phase rewind gradient 26 when the phase encoding gradient 19 and the phase rewind gradient 26 each have the same strength.

The gradients in read direction $G_R$ and slice selection direction $G_S$ are thus arranged symmetrically as regards the point in time 29, but the phase encoding gradient 19 and phase rewind gradient 26 are arranged antisymmetrically. The gradients are thus arranged time-symmetrically with regard to the point in time 29.

A sequence block extends from one radio-frequency impulse to the next and has the length TR. The excitation section includes the excitation impulse 16 and the slice selection gradient 17. The detection section contains the read gradients 26. Provided this is present, an acquisition window is also open.

The bSSFP measurement sequence 12 is this case is representative of all SSFP measurement sequences, in which a steady state obtains between the excitation and the relaxation of the magnetization. Between the excitation pulses, the nuclear spins precess (e.g., free precession). The steady magnetization state is decisive for the strength of the MR signal.

In order to obtain the desired dynamic equilibrium, the gradient moment for all SSFP measurement sequences in each TR is to be the same; for the bSSFP measurement sequence, the gradient moment is to produce the value zero as well as possible over a repetition time TR. Since gradients may have a bipolar effect on the nuclear spins, it is possible to revise their effect by opposing gradients. This applies independently of the sampling type of the k-space (e.g., also for the embodiment according to FIG. 4).

Figure 3:
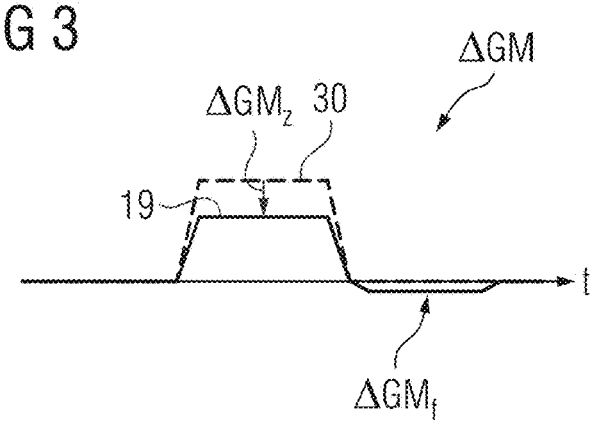
FIG. 3 shows an exemplary first gradient pulse with added gradient correction term.

FIG. 3 shows a gradient pulse (e.g., a phase encoding gradient in a predetermined sequence block). Without taking account of the self terms and cross terms, the gradient pulse 30 shown as a dashed line would be applied as a phase rewind gradient. For correction of the gradient moment, however, a compensation moment $\Delta GM$ is added to the gradient moment, where both a positive and also a negative compensation moment $\Delta GM$ may be added. In general terms, the compensation moment is then added or subtracted.

In this case, the compensation moment $\Delta GM$ may have an additional portion $\Delta GM_z$ and a free portion $\Delta GM_f$. The free portion is applied after the gradient pulse 30. The free portion compensates for oscillations in the magnetic resonance installation. What is involved here is a continuous correction, which is undertaken for as long as the oscillations are present.

The gradient pulse shown by a solid line (e.g., the phase rewind gradient 26) is then applied in the magnetic resonance measurement. The free portion $\Delta GM_f$ and the additional portion $\Delta GM_z$ may be taken into account via a pre-emphasis filter. Both portions $\Delta GM_z$ and $\Delta GM_f$ may be implemented independently of one another. Both, or just one of the two, may be implemented via the pre-emphasis filter. The other portion may be not taken into account at all, or the other portion may also be permanently implemented in the magnetic resonance sequence. Then, however, the respective value may possibly have to be adapted manually.

Illustrated in FIG. 3 is a form of embodiment, in which, at a predetermined point in time per sequence block (per TR), a correction of the gradients is achieved by applying an additional gradient moment (e.g., compensation field or compensation moment ΔGM). In FIG. 3 in this case, purely by way of example, the phase rewind gradient 26 is shown. For example, a compensation moment ΔGM in the form of a free portion $\Delta GM_f$ and/or an additional portion $\Delta GM_z$ may also be provided for any other gradient pulse and, for example, for a read rewind gradient 27 via a correction term.

Figure 4:
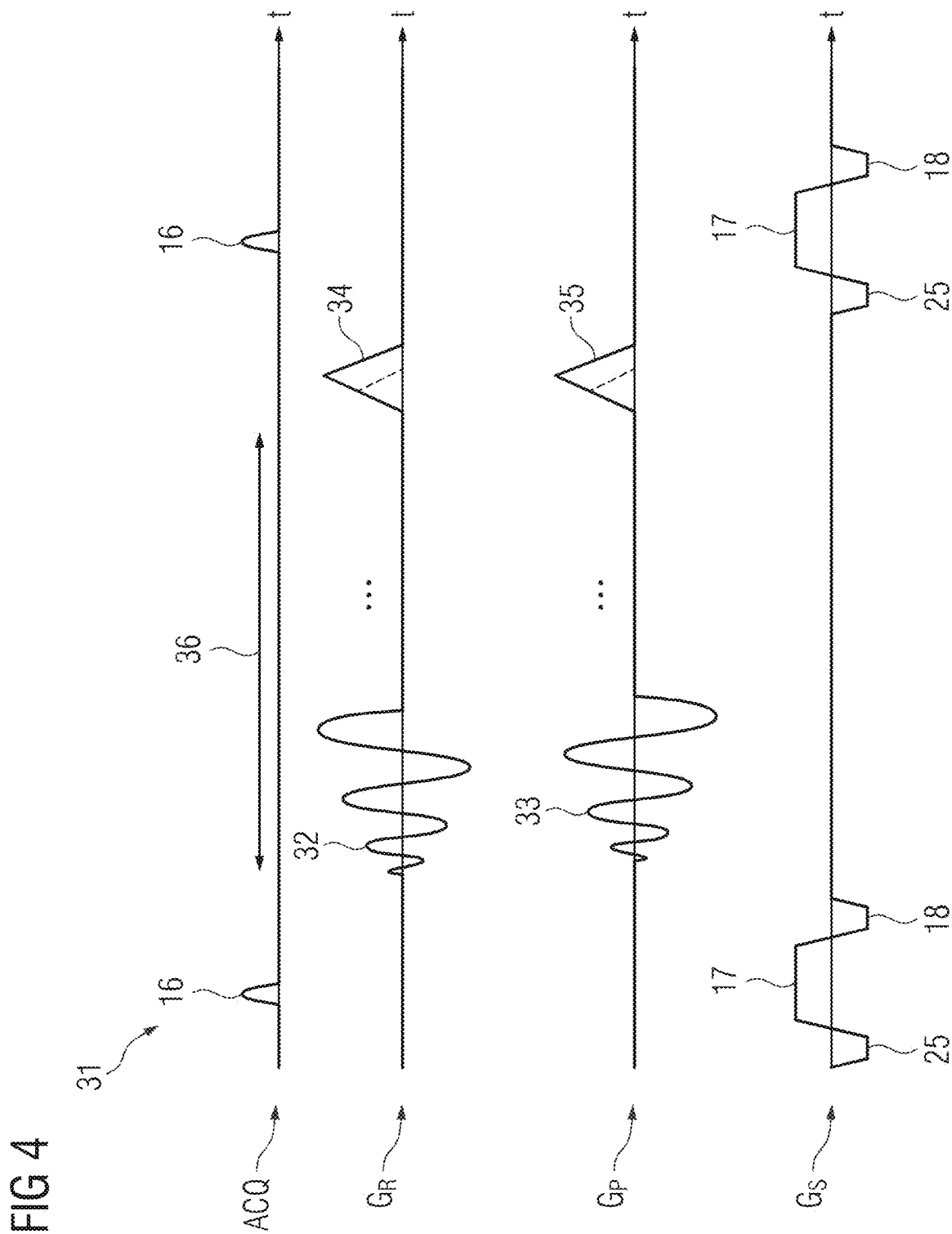
FIG. 4 shows an exemplary bSSFP sequence diagram with spiral-shape k-space sampling.

FIG. 4 shows a bSSFP sequence diagram 31 for bSSFP measurement sequence 13 with a spiral-shaped sampling scheme. The explanations as given for FIG. 2 apply, provided the reference characters match.

By contrast with the Cartesian sampling scheme, in a spiral sequence of phase encoding gradients, two read encoding directions are used instead, which in FIG. 4, for the sake of clarity, are labeled $G_R$ and $G_P$. In order to achieve a spiral-shaped k-space trajectory, oscillating gradients 32 and 33 are applied in each case in both read encoding directions.

To balance out the gradient moments, a read rewind gradient 34 and a phase rewind gradient 35 are located at the end of the oscillating gradients 32 and 33 applied. The uncorrected gradient pulses are shown as dashed lines. Because of the correction terms of the present embodiments, the gradient pulses 34, 35 are corrected; however, a compensation field (e.g., additional compensation field) is applied, for example, so that the rewind gradient pulses 34 and 35 are ultimately output as shown by the solid line. Through this, another gradient moment (e.g., corrected gradient moment) is obtained in both read encoding directions $G_R$ and $G_P$. The bSSFP measurement sequence 13 is thereby "fully balanced" over a repetition time $T_R$ (e.g., the sums of the gradient moments in all directions are equal to zero over a repetition time $T_R$).

A sequence block extends, as in the embodiment according to FIG. 2, from one radio-frequency impulse 16 to the next and has the length $T_R$. The excitation section includes the excitation impulse 16 and the slice selection gradient 17. In the detection section, the measurement signals 36 are recorded. However, in this process, no k-space rows are recorded; instead a spiral-shaped sampling takes place.

Instead of the bSSFP measurement sequence, any other SSFP measurement sequence with a spiral-shaped k-space sampling may be used.

Figure 5:
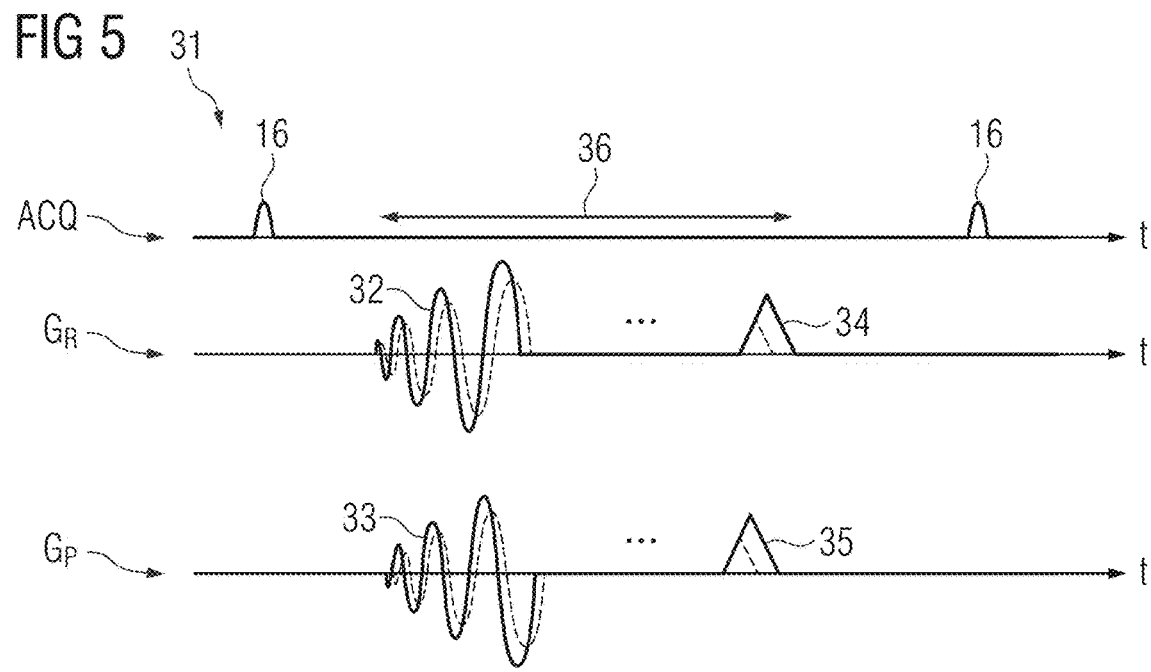
FIG. 5 shows the read gradient impulses of FIG. 4 with added compensation field.

FIG. 5 once again shows a spiral-shaped sampling sequence, as in FIG. 4, with particular focus on the two read encoding gradients $G_R$ and $G_P$ In a similar way to the modification of the rewind gradient pulses 34 and 35, the oscillating gradient pulses 32 and 33 may be corrected in accordance with the present embodiments (e.g., provided with a pre-emphasis). In FIG. 5, the gradient curves 32, 33, which have been applied uncorrected, are shown by dashed lines. The gradient pulses taking account of the correction term of the present embodiments (e.g., with pre-emphasis) are shown by solid lines. FIG. 5 shows that a correction term may also be implemented by a variable modification of the gradient strength of an oscillating gradient. As shown in FIG. 5, a continuous correction may be involved here (e.g., during the entire duration of the gradient pulse 32, 33 a corrected gradient (the uncorrected gradient plus a compensation field) is applied). The correction of the oscillating gradients 32, 33 may be brought about with a pre-emphasis filter.

In FIG. 5, purely by way of example, the gradients 32 and 33 in the read encoding direction are shown. For example, a compensation field or a compensation moment ΔGM in the form of a free portion $\Delta GM_f$ and/or an additional portion $\Delta GM_z$, may also be provided for any other impulse and, for example, for a read gradient 32 and a read rewind gradient 34 and/or for a slice rewinder 18 or slice prewinder 15.

The gradients 17, 18, 19, 21, 22, 25, 26, 27, 30, 32, 33, 34, 35 shown in the FIGS. 2 to 5 are each a gradient pulse.

The gradients 17, 18, 19, 21, 22, 25, 26, 27, 30, 32, 33, 34, 35 shown in FIGS. 2 to 5 as solid lines may be the nominal gradient $G_{nom}$ (e.g., that this form should be present in the magnetic resonance measurement). However, because of imperfections, this is not the case when the nominal gradients are also arranged in this way. However, if the pre-emphasis is calculated-in beforehand, the nominal gradient $G_{nom}$ may be obtained by energizing a gradient coil to create a pre-emphasized gradient $G_{pre}$ at the end. The pre-emphasized gradient $G_{pre}$ may be computed by the formula given above.

The use of the gradient pulse 30 to add the compensation moment ☐GM is possible, as already described. However, basically a compensation field or a part of the compensation field may be added to any of the gradient pulses shown. In one embodiment, a continuous or partly continuous correction may be provided, since further interactions may be avoided thereby. The gradient moments in each sequence block where possible are balanced out at the point in time directly before the excitation pulses, since then, a steady state will be obtained. A balancing-out at the times at which the signals are read out improves the image quality further.

Figure 6:
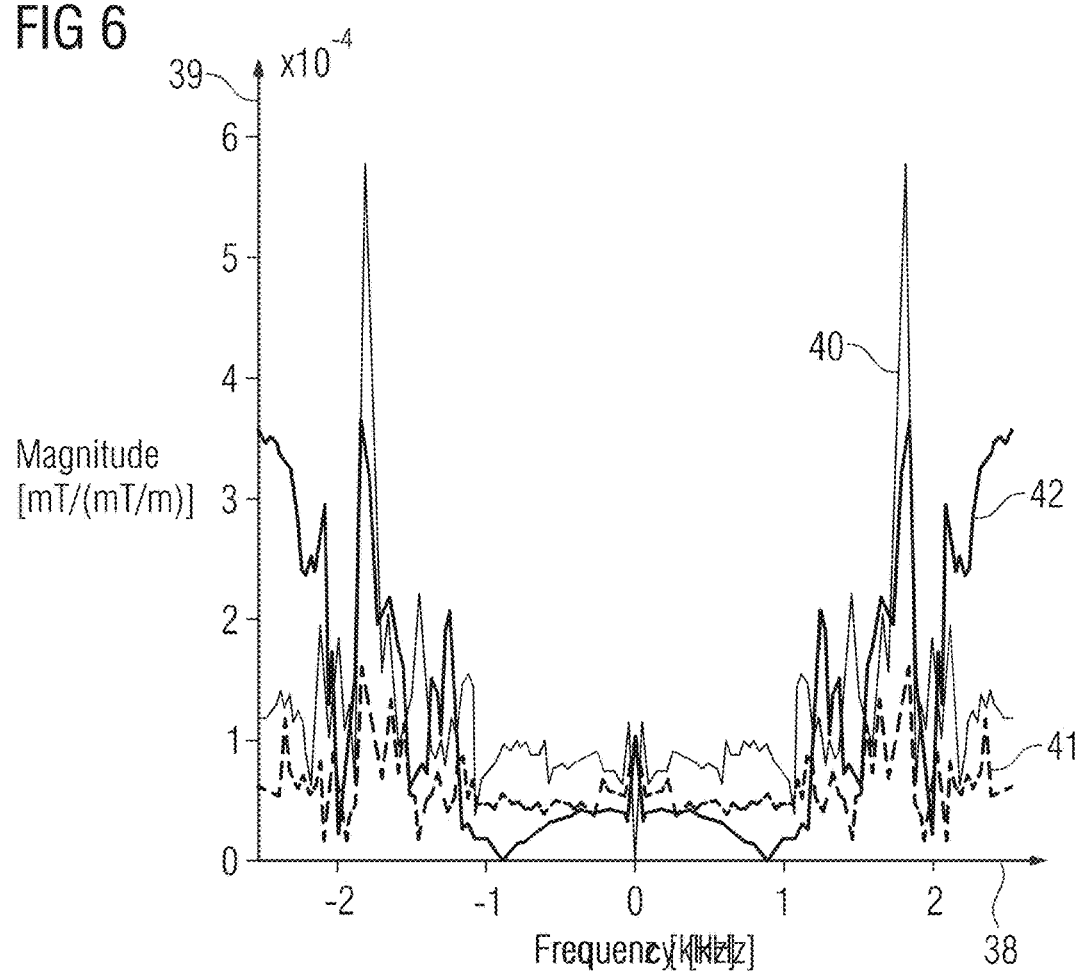
FIG. 6 shows an exemplary transfer function for the order 0.

The transfer function GSTF used for determination with 0 components $GSTF_x$, $GSTF_y$ and $GSTF_z$, is shown with a magnitude portion in FIG. 6. The frequency in kHz is plotted on the axis 38, and a standardized magnitude value on the axis 39. The line 40 shows the component for x-gradients, line 41 shows the components for y-gradients, and line 42 shows the component for z-gradients. The components may be measured with the field camera method, for example.

Using the formula already presented $$\Delta B_{k,l=0}(t) = \mathcal{F}^{-1}(\mathcal{F}\{G_{nom,k}(t)\} \cdot GSTF_{k,l}(f)).$$

from the transfer function GSTF or components $GSTF_x$, $GSTF_y$ and $GSTF_z$ of the transfer function GSTF, a change in the magnetic field $\Delta B_{0,x}$, $\Delta B_{0,y}$ and $\Delta B_{0,z}$ may be established in each case. From this, a phase change Δϕ is produced.

Figure 7:
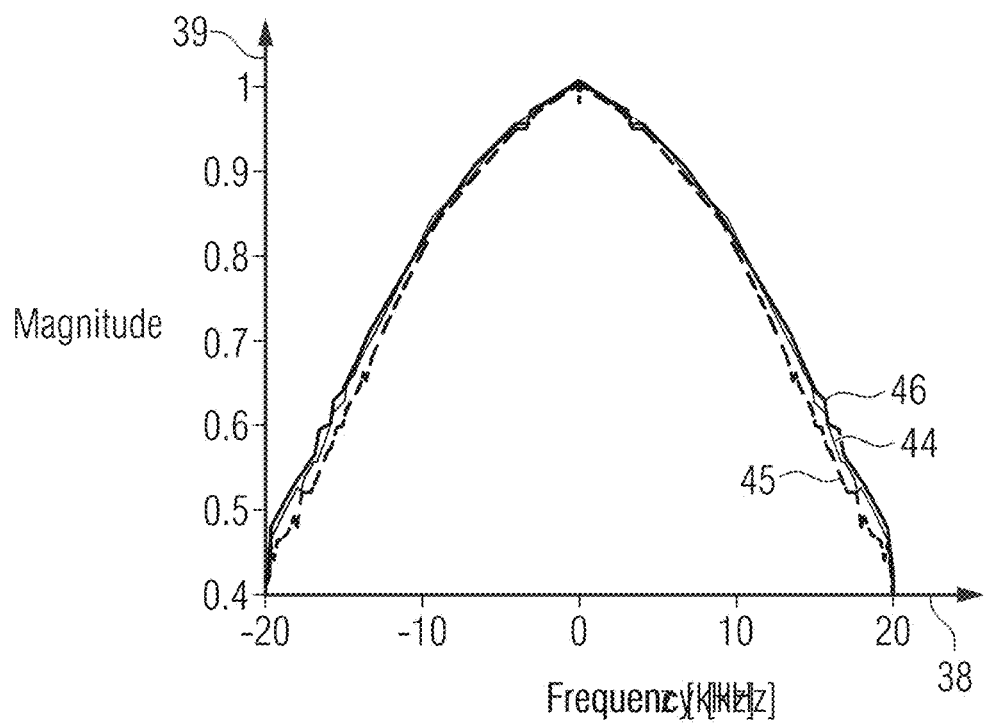
FIG. 7 shows magnitude values of a transfer function for the order 1.

FIG. 7 shows the magnitude portion of the components $GSTF_{xx}$, $GSTF_{yy}$ and $GSTF_{zz}$ of the transfer function GSTF, and thereby of the 1st order. Once again, the frequency in kHz is plotted on the axis 38, and a standardized magnitude value is plotted on the axis 39. In this case, the gradient system may be embodied as a lowpass filter: while low frequencies are transmitted almost in a ratio of 1:1, the portion of higher frequencies is greatly reduced.

The line 44 shows the component $GSTF_{xx}$, line 45 shows the component $GSTF_{yy}$, and line 46 shows the component $GSTF_{zz}$. These components too may be measured with the field camera method, for example.

Figure 8:
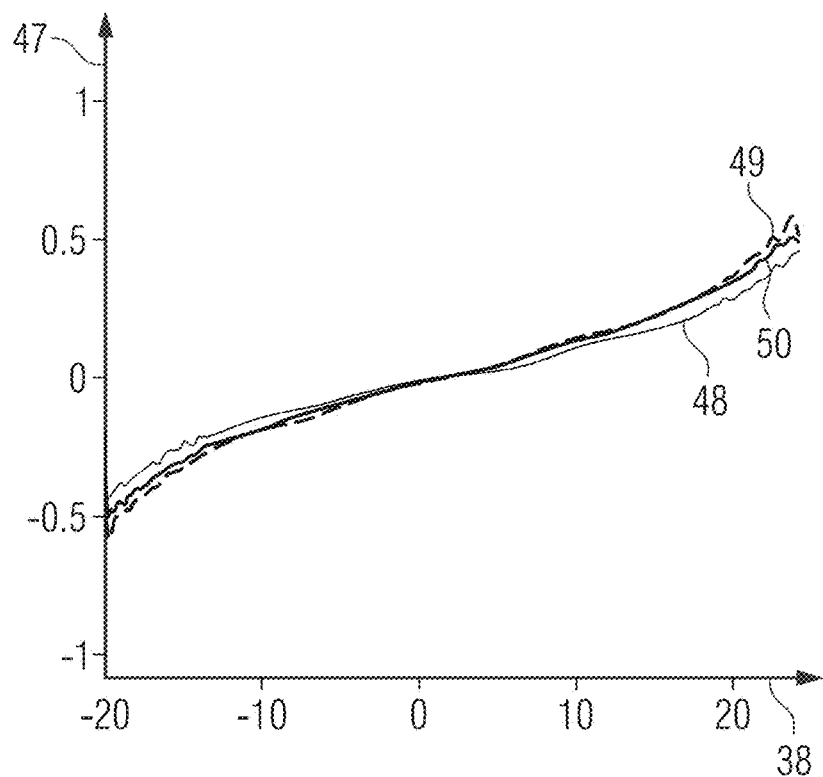
FIG. 8 shows phase values of a transfer function for the order 1.

FIG. 8 shows the phase portion of the components $GSTF_{xx}$, $GSTF_{yy}$ and $GSTF_{zz}$ of the transfer function GSTF, and thereby of the 1st order. Once again, the frequency in kHz is plotted on the axis 38, and a standardized phase value is plotted on the axis 47.

The line 48 shows the phase values of the component $GSTF_{xx}$, the line 49 shows the phase values of the component $GSTF_{yy}$, and the line 50 shows the phase values of the component $GSTF_{zz}$. These components too may be measured with the field camera method.

The components shown in FIGS. 7 and 8 may be used for correction of the GIRF-based artifacts of the self terms of the gradient pulses. The 0th order in accordance with FIG. 6 may be employed to establish the basic magnetic field change. The computation of pre-emphasized gradients may be established using the relationship already described $$G_{pre,k}(t) = \mathcal{F}^{-1}\{(\mathcal{F}\{G_{nom,k}(t)\}/\text{GSTF}_k^{l=1}(f)\}).$$

Figure 9:
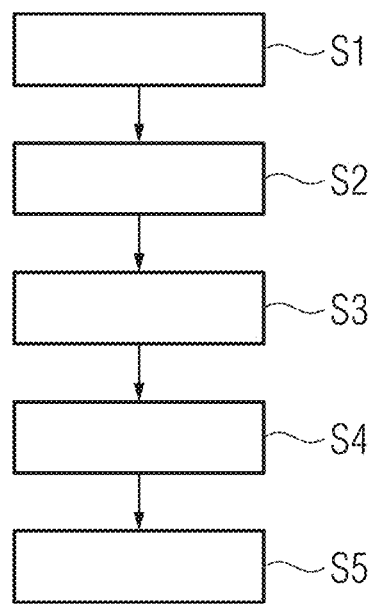
FIG. 9 shows a first exemplary execution scheme for recording a magnetic resonance dataset.

FIG. 9 shows a first flow diagram for recording a magnetic resonance image dataset.

In act S1, a transfer function GSTF, or, more precisely, at least the 0th order of the components $\text{GSTF}_x$, $\text{GSTF}_y$, and $\text{GSTF}_z$, is provided. This provision may be undertaken independently of the following acts.

This may be used in order to establish an effect of the gradient pulses and compensate for the effect via a B0 or phase correction or via a correction of the gradient pulses (e.g., by application of compensation fields and/or compensation gradient moments).

In act S2, a magnetic resonance sequence (e.g., an SSFP magnetic resonance sequence and a bSSFP magnetic resonance sequence 12 or 13) may be provided.

Usually, after the loading of a magnetic resonance sequence in act S3, parameters such as the location of the slice or the slices, the resolution, the number of image elements, etc., are set. Only after this is the exact configuration of the gradients fixed.

The sequence of gradients or gradient pulses produced by the magnetic resonance sequence 12 may either be used as a whole in order to compute the pre-emphasized gradient $G_{pre1}$ taking into account all effects in act S4. The effects taken into account are at least self terms of the 1st order, in a few forms of embodiment cross terms, and/or magnetic field change of the basic magnetic field $B_0$. Then, in act S5, with the magnetic resonance sequence, a magnetic resonance image dataset is recorded. This may be a 2D image dataset with one or more slices, a 3D image dataset, or also a 4D image dataset. In this case, the pre-emphasis filter p is also employed, via which the correction takes place. Using the pre-emphasis filter p, a compensation moment in the form of an additional portion $\Delta GM_z$ and also of a free portion $\Delta GM_f$ may be created as a correction term.

Figure 10:
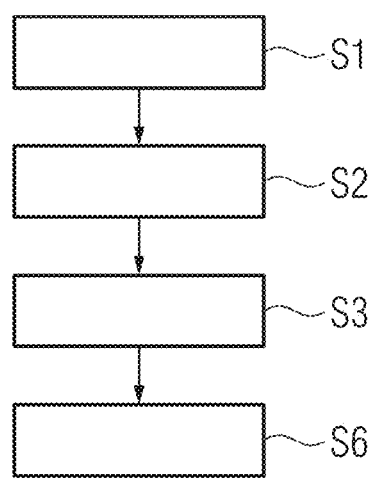
FIG. 10 shows a second exemplary execution scheme for recording a magnetic resonance dataset.

FIG. 10 shows a second embodiment of an execution scheme for recording a magnetic resonance dataset. After the acts S1 to S3, the provision of the transfer function and of the magnetic resonance sequence as well as the setting of the parameters of the magnetic resonance sequence, this has the act S6. In this act, section-by-section (e.g., for a repetition time $T_R$), the gradient pulses are collectively sent as a digital gradient execution signal to a control facility, a pre-emphasis filter p1 is applied to the gradient pulses, and the filtered gradient pulses are transferred as a pre-emphasized gradient signal $G_{pre1}$ to the magnetic resonance installation.

In this case, the pre-emphasis filter p1 is simple to realize, since from short sections, as described above, nominal gradient pulses $G_{nom}$ may be converted into pre-emphasized gradient pulses $G_{pre1}$.

The repeated computation is necessary since in different sequence blocks at least the phase encoding gradient 19 and then also the phase rewind gradient 26 have different values. This form of embodiment is, for example, preferred for a Cartesian sampling with ongoing sequence blocks.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for recording a magnetic resonance image dataset with a magnetic resonance installation having a gradient system, the method comprising:
    providing a magnetic resonance sequence for carrying out a magnetic resonance measurement, wherein the magnetic resonance sequence has a series of sequence blocks and an excitation section, and at least one detection section is present in each sequence block of the series of sequence blocks, and wherein the magnetic resonance sequence has at least one gradient pulse;
    providing at least one correction term to compensate for a magnetic field change, wherein the magnetic field change is produced as a change of an actual magnetic field compared to a setpoint magnetic field by the at least one gradient pulses, wherein the magnetic field change is established via a transfer characteristic of the gradient system of the magnetic resonance installation, and the transfer characteristic represents the system characteristic of the gradient system in amplitude, phase, or amplitude and phase of different frequencies;
    compensating for the magnetic field change using the at least one correction term;
    recording, using the magnetic resonance installation, at least one magnetic resonance image dataset with the magnetic resonance sequence using the at least one correction term; and
    compensating for deviations of the at least one gradient pulse using a transfer characteristic-based pre-emphasis filter for the gradient system, the magnetic resonance installation comprising the transfer characteristic-based pre-emphasis filter for the gradient system.

2. The method of claim 1, wherein a Steady State Free Precession (SSFP) measurement sequence is used as the magnetic resonance sequence.

3. The method of claim 1, further comprising creating a compensation field using the at least one correction term,
    wherein the compensation field is applied at least in part after at least one detection section of the magnetic resonance sequence.

4. The method of claim 1, wherein the magnetic field change is a magnetic field change of the basic magnetic field, and the correction term is used to create a compensation phase or a basic compensation field.

5. The method of claim 4, wherein the magnetic field change of the basic magnetic field is computed as:

$$\Delta B_{k,l=0}(t) = \mathfrak{I}^{-1}(\mathfrak{I}\{\text{Gnom},k(t)\} \cdot \text{GSTFk}, l(f)\}),$$

wherein l refers to the 0th order of a transfer function of the gradient system of the magnetic resonance installation, k refers to a gradient axis, $\mathfrak{I}$ refers to a Fourier transform, and $G_{nom,k}$ refers to the at least one gradient pulse applied to the gradient axis.

6. The method of claim 1, wherein the magnetic field change is a magnetic field change of the at least one gradient pulse, and the correction term is used to create a compensation gradient moment.

7. The method of claim 6, further comprising storing the correction term for the compensation moment in a pre-emphasis filter for the gradient system of the magnetic resonance installation.

8. The method of claim 7, wherein the pre-emphasis filter is used exclusively for correction of the magnetic field change of the at least one gradient pulse.

9. The method of claim 6, further comprising adding the compensation gradient moment to a gradient pulse after the setting of parameters of the magnetic resonance sequence.

10. The method of claim 1, wherein the magnetic field change is a magnetic field change of a field term of an order greater than 1, and the correction term is determined to create a compensation field moment.

11. The method of claim 1, wherein a transfer function or a Fourier-transform of the transfer function is used as the transfer characteristic.

12. A non-transitory computer-readable storage medium that stores instructions executable by a control facility to record a magnetic resonance image dataset with a magnetic resonance installation having a gradient system, the instructions comprising:
providing a magnetic resonance sequence for carrying out a magnetic resonance measurement, wherein the magnetic resonance sequence has a series of sequence blocks and an excitation section, and at least one detection section is present in each sequence block of the series of sequence blocks, and wherein the magnetic resonance sequence has at least one gradient pulse;
providing at least one correction term to compensate for a magnetic field change, wherein the magnetic field change is produced as a change of an actual magnetic field compared to a setpoint magnetic field by the at least one gradient pulse, wherein the magnetic field change is established via a transfer characteristic of the gradient system of the magnetic resonance installation, and the transfer characteristic represents the system characteristic of the gradient system in amplitude, phase, or amplitude and phase of different frequencies, and wherein the magnetic field change is a magnetic field change of the at least one gradient pulse, and the at least one correction term is used to create a compensation gradient moment;
compensating for the magnetic field change using the at least one correction term;
recording, using the magnetic resonance installation, at least one magnetic resonance image dataset with the magnetic resonance sequence using the at least one correction term; and
storing the at least one correction term for the compensation moment in a pre-emphasis filter for the gradient system of the magnetic resonance installation,
wherein the pre-emphasis filter is used exclusively for correction of the magnetic field change of the at least one gradient pulse.

13. The non-transitory computer-readable storage medium of claim 12, wherein a Steady State Free Precession (SSFP) measurement sequence is used as the magnetic resonance sequence.

14. The non-transitory computer-readable storage medium of claim 12, wherein the instructions further comprise creating a compensation field using the at least one correction term, and
wherein the compensation field is applied at least in part after at least one detection section of the magnetic resonance sequence.

15. The non-transitory computer-readable storage medium of claim 12, wherein the magnetic field change is a magnetic field change of the basic magnetic field, and the correction term is used to create a compensation phase or a basic compensation field.

16. A magnetic resonance installation comprising:
a gradient system; and
a control facility,
wherein the control facility is configured to record a magnetic resonance image dataset with a magnetic resonance installation having a gradient system, the recordation of the magnetic resonance image dataset comprising:
provision of a magnetic resonance sequence for carrying out a magnetic resonance measurement, wherein the magnetic resonance sequence has a series of sequence blocks and an excitation section, and at least one detection section is present in each sequence block of the series of sequence blocks, and wherein the magnetic resonance sequence has at least one gradient pulse;
provision of at least one correction term to compensate for a magnetic field change, wherein the magnetic field change is produced as a change of an actual magnetic field compared to a setpoint magnetic field by the at least one gradient pulses, wherein the magnetic field change is established via a transfer characteristic of the gradient system of the magnetic resonance installation, and the transfer characteristic represents the system characteristic of the gradient system in amplitude, phase, or amplitude and phase of different frequencies;
compensation for the magnetic field change using the at least one correction term; and
recordation, by the magnetic resonance installation, of at least one magnetic resonance image dataset with the magnetic resonance sequence using the at least one correction term,
wherein the magnetic resonance installation further comprises a transfer characteristic-based pre-emphasis filter for the gradient system, and the transfer characteristic-based pre-emphasis filter is used to compensate for deviations of the at least one gradient pulse.

17. A method for recording a magnetic resonance image dataset with a magnetic resonance installation having a gradient system, the method comprising:
providing a magnetic resonance sequence for carrying out a magnetic resonance measurement, wherein the magnetic resonance sequence has a series of sequence blocks and an excitation section, and at least one detection section is present in each sequence block of the series of sequence blocks, and wherein the magnetic resonance sequence has at least one gradient pulse;
providing at least one correction term to compensate for a magnetic field change, wherein the magnetic field change is produced as a change of an actual magnetic field compared to a setpoint magnetic field by the at least one gradient pulses, wherein the magnetic field change is established via a transfer characteristic of the gradient system of the magnetic resonance installation, and the transfer characteristic represents the system characteristic of the gradient system in amplitude, phase, or amplitude and phase of different frequencies;

compensating for the magnetic field change using the at least one correction term; and recording, using the magnetic resonance installation, at least one magnetic resonance image dataset with the magnetic resonance sequence using the at least one correction term, wherein the magnetic field change is a magnetic field change of a basic magnetic field, and the at least one correction term is used to create a compensation phase or a basic compensation field, wherein the magnetic field change of the basic magnetic field is computed as:

$$\Delta B_{k,l=0}(t) = æ^{-1}\{Gnom,k(t)\} \cdot GSTFk,l(f)\}), \text{ and}$$

wherein l refers to the 0th order of a transfer function of the gradient system of the magnetic resonance installation, k refers to a gradient axis, æ refers to a Fourier transform, and Gnom,k refers to the at least one gradient pulse applied to the gradient axis.

18. A method for recording a magnetic resonance image dataset with a magnetic resonance installation having a gradient system, the method comprising:

providing a magnetic resonance sequence for carrying out a magnetic resonance measurement, wherein the magnetic resonance sequence has a series of sequence blocks and an excitation section, and at least one detection section is present in each sequence block of the series of sequence blocks, and wherein the magnetic resonance sequence has at least one gradient pulse;

providing at least one correction term to compensate for a magnetic field change, wherein the magnetic field change is produced as a change of an actual magnetic field compared to a setpoint magnetic field by the at least one gradient pulses, wherein the magnetic field change is established via a transfer characteristic of the gradient system of the magnetic resonance installation, and the transfer characteristic represents the system characteristic of the gradient system in amplitude, phase, or amplitude and phase of different frequencies, and wherein the magnetic field change is a magnetic field change of the at least one gradient pulse, and the at least one correction term is used to create a compensation gradient moment;

storing the at least one correction term for the compensation moment in a pre-emphasis filter for the gradient system of the magnetic resonance installation, compensating for the magnetic field change using the at least one correction term;

recording, using the magnetic resonance installation, at least one magnetic resonance image dataset with the magnetic resonance sequence using the at least one correction term, wherein the pre-emphasis filter is used exclusively for correction of the magnetic field change of the at least one gradient pulse.

* * * * *